United States Patent
Brink et al.

(10) Patent No.: US 9,466,534 B1
(45) Date of Patent: Oct. 11, 2016

(54) COINTEGRATION OF DIRECTED SELF ASSEMBLY AND SIDEWALL IMAGE TRANSFER PATTERNING FOR SUBLITHOGRAPHIC PATTERNING WITH IMPROVED DESIGN FLEXIBILITY

(71) Applicant: International Business Machines Corporation, Armonk, NY (US)

(72) Inventors: Markus Brink, White Plains, NY (US); Josephine B. Chang, Bedford Hills, NY (US); Michael A. Guillorn, Cold Springs, NY (US); Hsinuyu Tsai, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/963,824

(22) Filed: Dec. 9, 2015

(51) Int. Cl.
| | |
|---|---|
| *H01L 29/06* | (2006.01) |
| *H01L 21/8234* | (2006.01) |
| *H01L 21/308* | (2006.01) |
| *H01L 27/088* | (2006.01) |

(52) U.S. Cl.
CPC ... *H01L 21/823431* (2013.01); *H01L 21/3085* (2013.01); *H01L 21/3086* (2013.01); *H01L 27/0886* (2013.01)

(58) Field of Classification Search
CPC .................. H01L 21/823431; H01L 21/3086; H01L 27/0886; H01L 21/3085
USPC ........................... 438/978, 694, 703; 257/623
See application file for complete search history.

(56) References Cited

U.S. PATENT DOCUMENTS

| | | | |
|---|---|---|---|
| 8,455,932 B2 | 6/2013 | Khakifirooz et al. | |
| 9,023,225 B2 | 5/2015 | Oyama et al. | |
| 2012/0280290 A1* | 11/2012 | Khakifirooz | H01L 27/0207 257/288 |
| 2013/0200498 A1 | 8/2013 | Mangan | |
| 2014/0183661 A1* | 7/2014 | Lin | H01L 21/823431 257/401 |
| 2014/0227857 A1* | 8/2014 | Youn | H01L 21/76229 438/427 |
| 2014/0252630 A1 | 9/2014 | Chang et al. | |
| 2014/0273476 A1 | 9/2014 | Cheng et al. | |
| 2014/0367833 A1 | 12/2014 | Brink et al. | |
| 2015/0024597 A1 | 1/2015 | Gao et al. | |
| 2015/0064912 A1* | 3/2015 | Jang | H01L 21/3086 438/696 |
| 2015/0097249 A1 | 4/2015 | Kim et al. | |
| 2015/0170973 A1* | 6/2015 | Kim | H01L 21/82382 438/702 |

(Continued)

OTHER PUBLICATIONS

Anonymous, "Selective Neutralization for Neutral Last Grapho-Epitaxy Directed Self-Assembly", IP.com, IPCOM000240420D, Jan. 29, 2015, pp. 1-3.

*Primary Examiner* — Phat X Cao
*Assistant Examiner* — Mohammad M Hoque
(74) *Attorney, Agent, or Firm* — Scully, Scott, Murphy & Presser, P.C.; Louis J. Percello, Esq.

(57) ABSTRACT

After forming transfer layer portions over a portion of a dielectric cap layer overlying a first portion of a substrate by a directed self-assembly process, a hard mask layer is formed over the dielectric cap layer to fill spaces between the transfer layer portions. Spacers are then formed over a portion of the hard mask layer overlying a second portion of the substrate by a sidewall image transfer process. A top semiconductor layer of the substrate is subsequently patterned using the transfer layer portions and the spacers as an etch mask to provide densely packed semiconductor fins in the first region and semi-isolated semiconductor fins in the second region of the substrate.

16 Claims, 9 Drawing Sheets

(56) References Cited

U.S. PATENT DOCUMENTS

2015/0311085 A1* 10/2015 Kozarsky ............ H01L 21/3086 257/401
2015/0318181 A1* 11/2015 Cantone ............ H01L 29/66795 438/702
2016/0020109 A1* 1/2016 Yoo ..................... H01L 21/3085 438/275
2016/0133726 A1* 5/2016 Sung ................ H01L 29/66795 438/283

* cited by examiner

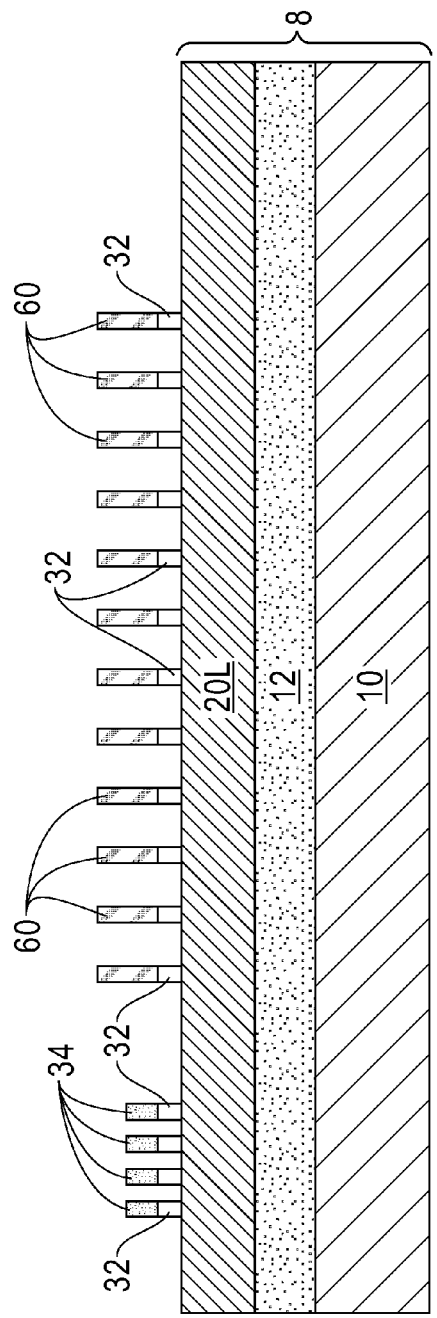
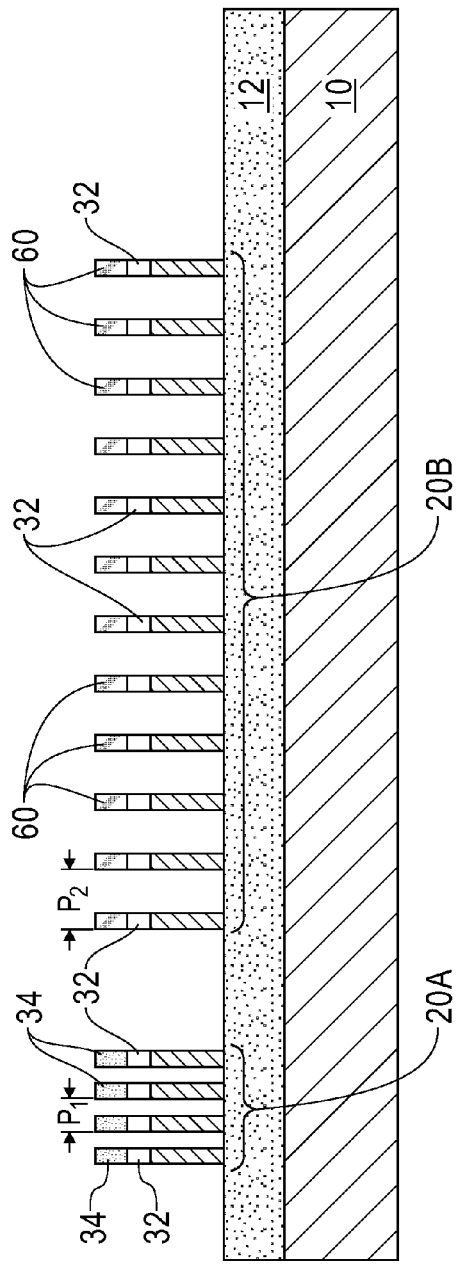
FIG. 10
FIG. 11

COINTEGRATION OF DIRECTED SELF ASSEMBLY AND SIDEWALL IMAGE TRANSFER PATTERNING FOR SUBLITHOGRAPHIC PATTERNING WITH IMPROVED DESIGN FLEXIBILITY

BACKGROUND

The present application relates to a pattern formation method, and more particularly to integration of densely packed semiconductor fins formed by a directed self-assembly (DSA) process and semi-isolated semiconductor fins formed by a sidewall image transfer (SIT) process on a single substrate.

Directed self-assembly (DSA) is a patterning technique that generates sub-lithographic line/space patterns through microphase separation of a block copolymer. The DSA process has shown promise in creating large areas of patterned lines with a minimum pitch equal to a natural period (i.e., pitch) of the block copolymer, and thus is suitable for making dense fin field effect transistors (FinFETs) in a logic area of an integrated circuit. However, the DSA process does not allow for forming patterned lines with a minimum pitch that is 1.5× the natural pitch of the block copolymer; since defects will occur within the DSA pattern. Since the pitch of patterned features determines the size of static random access memory (SRAM) cells and the minimum pitch in a SRAM area of the integrated circuit that is equal to 1.5× the natural pitch of the DSA material is desired to achieve high SRAM cell density, methods of forming nanoscale features with desirable pitches for both logic and SRAM devices remain needed.

SUMMARY

The present application provides methods of integration of densely packed semiconductor fins formed using a directed self-assembly (DSA) process and semi-isolated semiconductor fins formed using a sidewall image transfer (SIT) process on a single substrate. After forming transfer layer portions over a portion of a dielectric cap layer overlying a first portion of a substrate by a directed self-assembly process, a hard mask layer is formed over the dielectric cap layer to fill spaces between the transfer layer portions. Spacers are then formed over a portion of the hard mask layer overlying a second portion of the substrate by a sidewall image transfer process. A top semiconductor layer of the substrate is subsequently patterned using the transfer layer portions and the spacers as an etch mask to provide densely packed semiconductor fins in the first region and semi-isolated semiconductor fins in the second region of the substrate.

In one aspect of the present application, a method of forming a semiconductor structure is provided. The method includes forming a self-assembled structure comprising alternating first domains and second domains over a material stack that is located over a top semiconductor layer of a substrate, wherein the material stack includes a transfer layer and a process layer overlying the transfer layer, and the self-assembled structure overlies a first region of the top semiconductor layer. The second domains of the self-assembled structure are then removed, leaving the first domains protruding from a top surface of the process layer. After patterning the process layer and the transfer layer using the first domains as an etch mask to provide transfer layer portions over the top semiconductor layer, the remaining portions of the process layer are removed, leaving the transfer layer portions protruding from a top surface of the top semiconductor layer. Next, a hard mask layer is formed over the transfer layer portions and the top semiconductor layer to fill spaces between the transfer layer portions. Next, spacers are formed on sidewalls of a plurality of mandrels located over the hard mask layer. The plurality of mandrels overlies a second region of the top semiconductor layer. The plurality of mandrels are then removed, leaving the spacers protruding from a top surface of the hard mask layer. After patterning the hard mask layer using the spacers as an etch mask to provide hard mask layer portions, the top semiconductor layer is patterned using the transfer layer portions and the hard mask layer portions as an etch mask to provide a plurality of semiconductor fins.

In another aspect of the present application, a semiconductor structure is provided. The semiconductor structure includes a plurality of first semiconductor fins located in a first region of a substrate and having a first pitch and a plurality of second semiconductor fins located in a second region of the substrate and having a second pitch that is equal to a non-integer multiple of the first pitch.

BRIEF DESCRIPTION OF SEVERAL VIEWS OF THE DRAWINGS

FIG. 10 is a cross-sectional view of the exemplary semiconductor structure of FIG. 8 after patterning the dielectric cap layer using the transfer layer portions and vertical stacks of the hard mask layer portions and the spacers as an etch mask.

FIG. 11 is a cross-sectional view of the exemplary semiconductor structure of FIG. 8 after patterning a top semiconductor layer in the substrate using the transfer layer portions and the hard mask layer portions as an etch mask.

DETAILED DESCRIPTION

Figure 1:
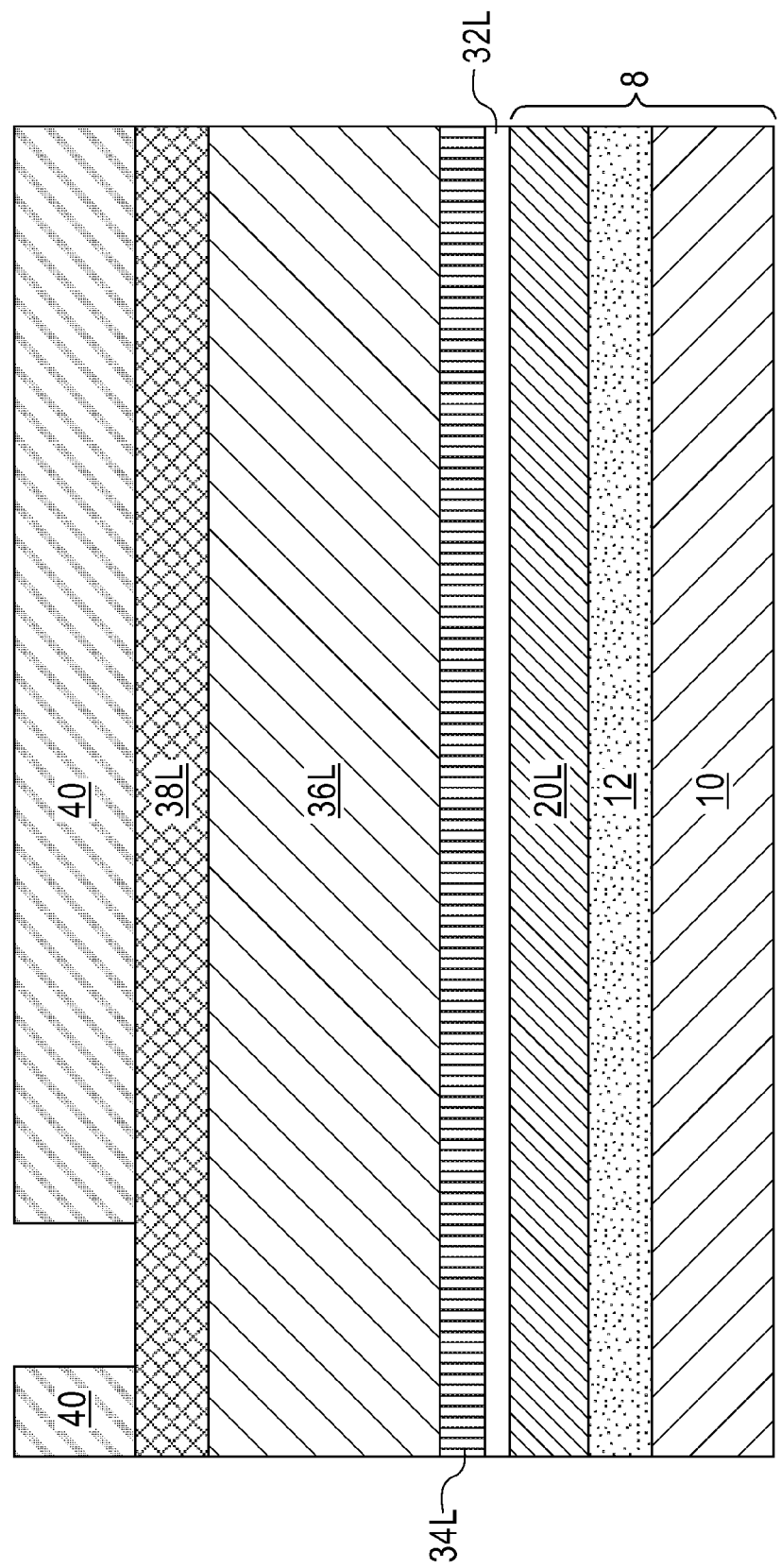
FIG. 1 is a cross-sectional view of an exemplary semiconductor structure after forming template structures over a material stack including, from bottom to top, a dielectric cap layer, a transfer layer, an organic planarization layer (OPL) and a process layer that is located over a substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes template structures 40 formed over a material stack. The material stack is formed on a substrate 8 and it includes, from bottom to top, a dielectric cap layer 32L, a transfer layer 34L, an organic planarization layer (OPL) 36L, and a process layer 38L. The template structures 40 are formed in a first region of the substrate 8 which can be a logic device region.

The substrate 8 may be formed from a bulk semiconductor substrate or a semiconductor-on-insulator substrate (SOI) known in the art. In one embodiment and as shown in FIG. 1, the substrate 8 can be an SOI substrate including a stack, from bottom to top, a handle substrate 10, a buried insulator layer 12 and a top semiconductor layer 20L.

The handle substrate 10 may include a semiconductor material such as, for example, Si, Ge, SiGe, SiC or SiGeC and an III-V compound semiconductor such as, for example, InAs, GaAs or InP. The handle substrate 10 provides mechanical support to the buried insulator layer 12 and the top semiconductor layer 20L. The thickness of the handle substrate 10 can be from 30 m to about 2 mm, although less and greater thicknesses can also be employed.

The buried insulator layer 12 may include a dielectric material such as silicon oxide, silicon nitride, silicon oxynitride, boron nitride or a combination thereof. In one embodiment, the buried insulator layer 12 may be formed by a deposition process, such as chemical vapor deposition (CVD) or physically vapor deposition (PVD). In another embodiment, the buried insulator layer 12 may be formed using a thermal growth process, such as thermal oxidation, to convert a topmost portion of the handle substrate 10. The thickness of the buried insulator layer 12 can be from 50 nm to 200 nm, although lesser or greater thicknesses can also be employed.

The top semiconductor layer 20L may include a semiconductor material such as, for example, Si, Ge, SiGe, SiC or SiGeC, and an III-V compound semiconductor such as, for example, InAs, GaAs or InP. The semiconductor materials of the top semiconductor layer 20L and the handle substrate 10 may be the same or different. Typically, each of the handle substrate 10 and the top semiconductor layer 20L comprises a single crystalline semiconductor material, such as, for example, single crystalline silicon.

The top semiconductor layer 20L can be formed by a deposition process, such as CVD or plasma enhanced chemical vapor deposition (PECVD). The top semiconductor layer 20L that is formed may have a thickness from 10 nm to 200 nm, although lesser or greater thicknesses can also be employed. Alternatively, the top semiconductor layer 20L may be formed using a Smart Cut® process where two semiconductor wafers are bonded together with an insulator in between.

The dielectric cap layer 32L may include a dielectric material such as silicon dioxide, silicon nitride, or silicon oxynitride. The dielectric cap layer 32L can be formed utilizing a conventional deposition process such as, for example, CVD or PECVD. Alternatively, the dielectric cap layer 32L can be formed by a thermal process such as, for example, oxidation or nitridation of a topmost portion of the top semiconductor layer 20L. Any combination of the above mentioned processes can also be used in forming the dielectric cap layer 32L. The dielectric cap layer 32L that is formed can have a thickness from 20 nm to 80 nm, although lesser or greater thicknesses can also be employed.

The transfer layer 34L may include a high dielectric constant (high-k) material having a dielectric constant that is greater than 7.5. In one embodiment, the transfer layer 34L includes a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The transfer layer 34L can be formed, for example, by CVD, atomic layer deposition (ALD) or PECVD. The thickness of the transfer layer 34L can be from 10 nm to 300 nm, although lesser and greater thicknesses can also be formed.

The OPL 36L may include a self-planarizing organic material that can provide a smooth and planar top surface when applied. In one embodiment, the OPL 36L includes a carbon-rich material. The term "carbon-rich" refers to a material having a composition comprising greater than 50% by weight carbon, preferably greater than 70% by weight carbon, and more preferably from 75% to 80% by weight carbon, based upon the total solids in the carbon-rich composition taken as 100% by weight. Exemplary carbon-rich materials include, but are not limited to, spin-on carbon (SOC) and amorphous carbon. The OPL 36L can be formed by CVD or spin coating. The thickness of the OPL 20 can be from 10 nm to 300 nm, although lesser and greater thicknesses can also be employed.

The process layer 38L represents one or more layers to be patterned, and may include one or more layers that have desirable interactions with a DSA material subsequently applied thereon. The DSA material can thus be induced to orient with phase boundaries perpendicular to the top surface of the process layer 38L. For example, the process layer 38L may include a neutral layer that is substantial neutral toward the different component in the DSA material. That is, the material in the neural layer does not show a strong affinity for one of the chemical components over the other chemical component in the DSA material, thus facilitating the formation of domains that are oriented perpendicularly to the top surface of the neutral layer. Alternatively, the process layer 38L may include a chemical guide layer containing pinning regions that have a high affinity for one of the components of the DSA material. The pining regions thus preferably bind to one of the components in the DSA material so as to induce the DSA material to orient with phase boundaries that are perpendicular to the top surface of the process layer 38L. The process layer 38L may also include layers having antireflective properties to facilitate lithography patterning process in formation of the template structures 40. In one embodiment, the process layer 38L may include a layer containing a silicon-containing antireflective coating (SiARC) material or a titanium-containing antireflective coating (TiARC) material as known in the art.

The template structures 40 may be used in conjunction with the process layer 38L to guide the phase separation and alignment of the DSA material. In one embodiment, the template structures 40 can be formed by applying a photoresist layer over the top surface of the process layer 38L and patterning the photoresist layer to expose a region of the process layer 38L in which a dense pattern is formed. The width of the space between template structures 40 is a function of an integer multiple of the natural period of the DSA material to avoid introducing defects within the DSA pattern. Further, the template structures 40 can be treated by known methods to adjust the wetting properties with respect to the DSA material. For example, the surfaces of the template structures 40 can be treated by depositing or grafting a suitable material that affects surface hydrophilicity of the template structures 40.

Figure 2:
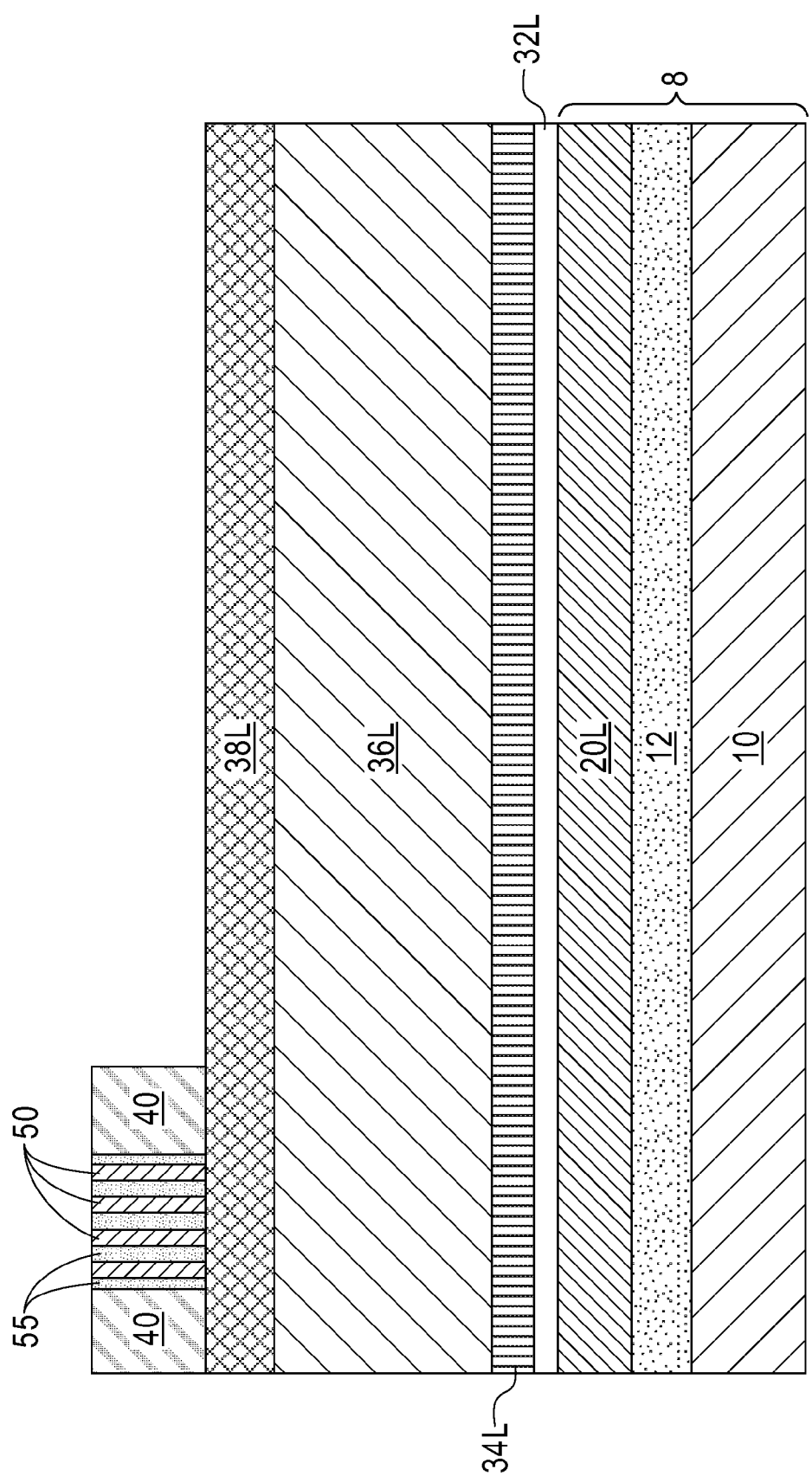
FIG. 2 is a cross-sectional view of the exemplary semiconductor structure of FIG. 1 after forming a self-assembled structure of alternating first domains and second domains over the process layer.

Referring to FIG. 2, a DSA material layer (not shown) is formed by depositing a DSA material onto the exposed portion of the process layer 38 and between template structures 40. The DSA material layer is then annealed, thereby forming a self-assembled structure including a vertically oriented lamellar pattern of alternating first domains 50 and second domains 55 protruding from the top surface of the process layer 38L. As used herein, the term "lamellar pattern" refers a phase domain pattern having first chemical component and second chemical component that are arranged alternately and parallel with respect to one another. Exemplary DSA materials include, but are not limited to, diblock copolymers, triblock copolymers, blends of homopolymers, blends of copolymers, and combinations thereof. The DSA material typically includes immiscible chemical components that have controlled sizes. Under suitable conditions, the immiscible chemical components self-organize into a nanoscale periodic pattern. By "nanoscale pattern" it is meant that features have a size of less than 50 nm. In one embodiment, the DSA material layer includes a diblock copolymer such as, for example, poly (styrene-block-methyl methacrylate) (PS-b-PMMA), poly (ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly (styrene-block-ferrocenyldimethylsilane) (PS-b-PFS), poly (butadiene-block-vinylpyridine) (PBD-b-PVP), poly(isoprene-block-methyl methacrylate) (PI-b-PMMA), poly (styrene-block-lactic acid) (PS-b-PLA) or poly(styrene-block-dymethylsiloxane) (PS-b-PDMS). In one embodiment, PS-b-PMMA is used.

To form the nanoscale periodic pattern, the DSA material is first dissolved in a suitable solvent to form a DSA material solution, which is then applied onto the process layer 38L and between template structures 40 to provide the DSA material layer. The solvent system used for dissolving the DSA material and forming the DSA material solution may comprise any suitable solvent including, but not limited to, toluene, propylene glycol monomethyl ether acetate (PG-MEA), propylene glycol monomethyl ether (PGME) and acetone. The DSA material solution can be applied by any suitable techniques including, but not limited to, spin coating, spraying and dip coating.

The microphase separation of the different chemical components contained in the DSA material can be achieved, for example, by annealing the DSA material layer at an elevated temperature. In one embodiment, the DSA material layer can be annealed by solvent vapor annealing or by thermal annealing at an elevated temperature to form the first domains 50 composed of a first chemical component of the DSA material, and the second domains 55 composed a second chemical component of the DSA material. The anneal may be performed, for example, at a temperature from about 180° C. to about 300° C. for a duration from 30 seconds to about 10 hours.

Each of the first domains 50 has a first width. Each of the second domains 55 has a second width. In some embodiments, the second width is the same as the first width. In other embodiments, the second width is different from the first width. Each of the first width and second widths are sub-lithographic, i.e., less than 50 nm.

Figure 3:
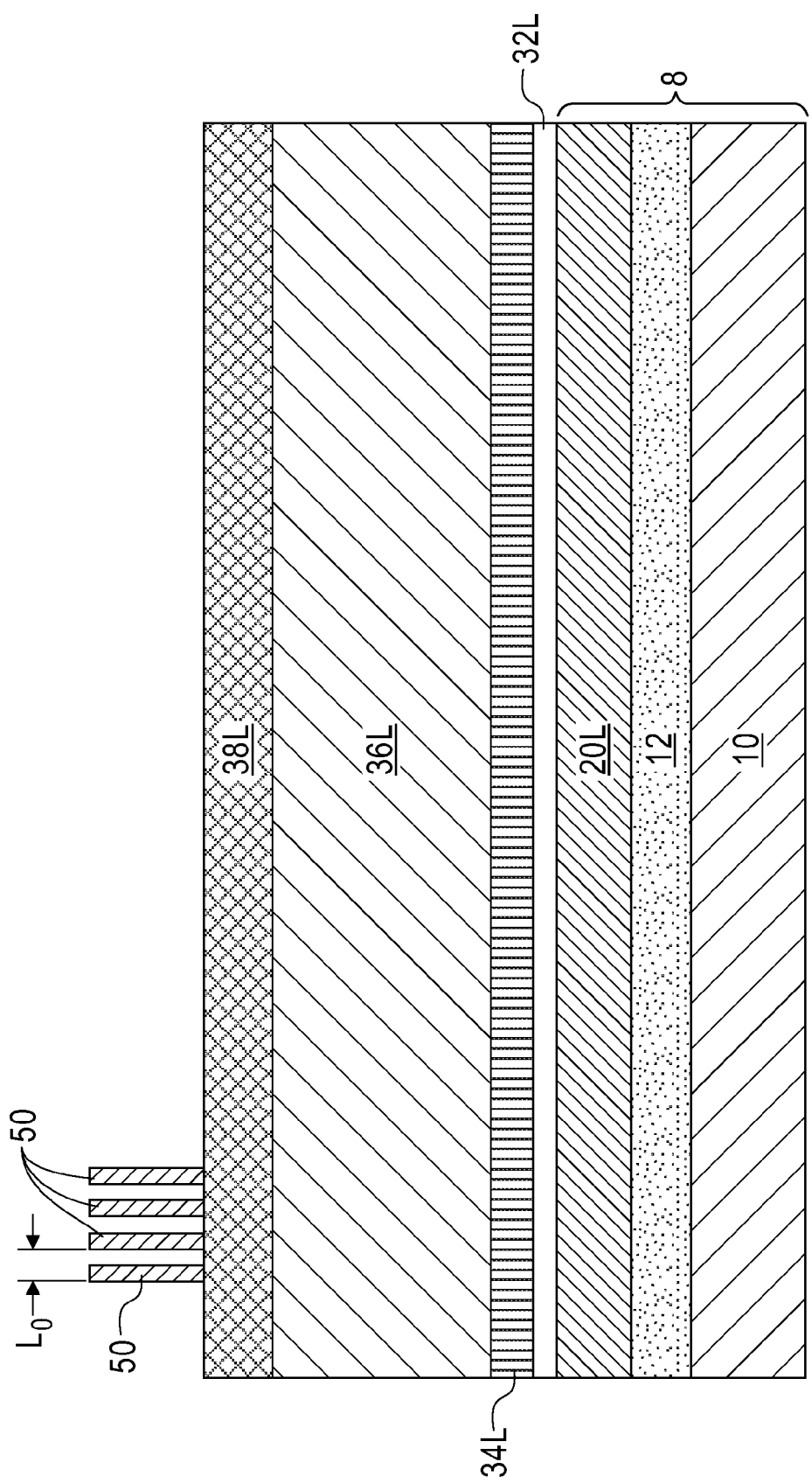
FIG. 3 is a cross-sectional view of the exemplary semiconductor structure of FIG. 2 after removing the second domains to provide a DSA pattern comprising the second domains protruding from a top surface of the process layer.

Referring to FIG. 3, one type of domain is removed selective to the other type of domain. In one embodiment and as shown in FIG. 3, the second domains 55 can be removed selective to first domains 50. In this case, the second chemical component of the DSA material is removed selective to the first chemical component. The removal of the second domains 55 selective to the first domains 50 can be performed, for example, by an anisotropic etch. For example, when the DSA material is a diblock copolymer of PS and PMMA (PS-b-PMMA), the PMMA component can be selectively removed by a dry etch using oxygen and/or argon and/or fluorocarbon gas chemistry, for example. A DSA pattern including the first domains 50 is formed over the dense pattern region of the process layer 38L. The first domains 50 constitute a set of protruding structures that protrudes above the top surface of the process layer 38L. After removal of the second domains 55, the template structures 40 may be removed utilizing solvent stripper or plasma etching.

Figure 4:
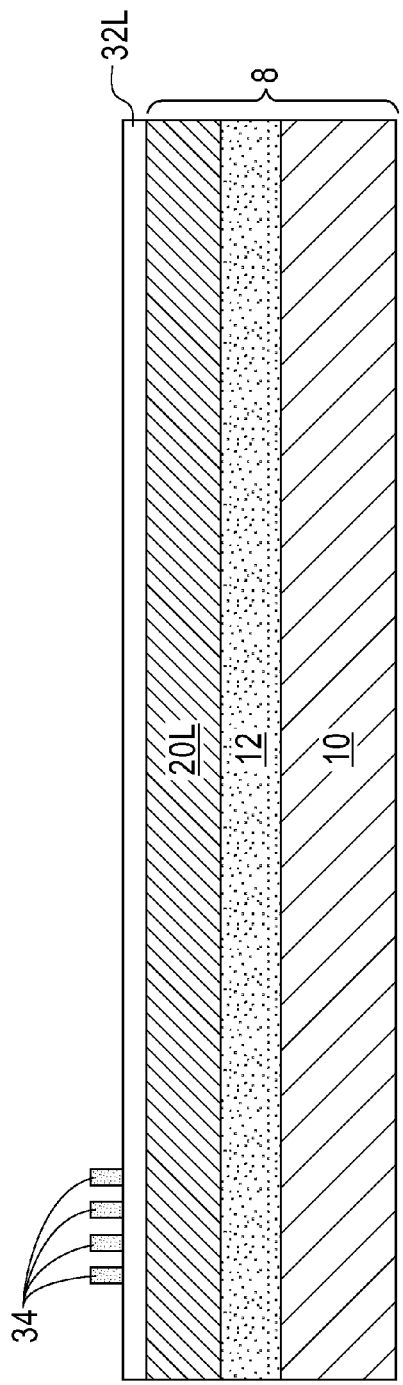
FIG. 4 is a cross-sectional view of the exemplary semiconductor structure of FIG. 3 after transfer the DSA pattern through the process layer, the OPL and the transfer layer to provide transfer layer portions.

Referring to FIG. 4, the DSA pattern is transferred through the process layer 38L, the OPL 36L and the transfer layer 34L. An anisotropic etch can be performed to remove the materials of the process layer 38L, the OPL 36L and the transfer layer 34L selective to the material of the dielectric cap layer 32L. The anisotropic etch can be a dry etch such as reactive ion etching (RIE) or a wet etch. The remaining portions of the transfer layer 34L constitute the transfer layer portions 34. The transfer layer portions 34 have a uniform width, which is the same as the width of the first domains 50, up to some small process bias due to the etch. The pitch of the transfer layer portions 34 is characterized by the natural pitch $L_0$ of the DSA material which is equal to a total width of two adjacent first and second domains 50, 55 as shown in FIG. 3.

The DSA pattern of the first domains 50 are subsequently removed, for example, by dissolving in a solvent. The remaining portions of the process layer 38L and the OPL layer 36L can also be removed, for example, by a wet etch.

Figure 5:
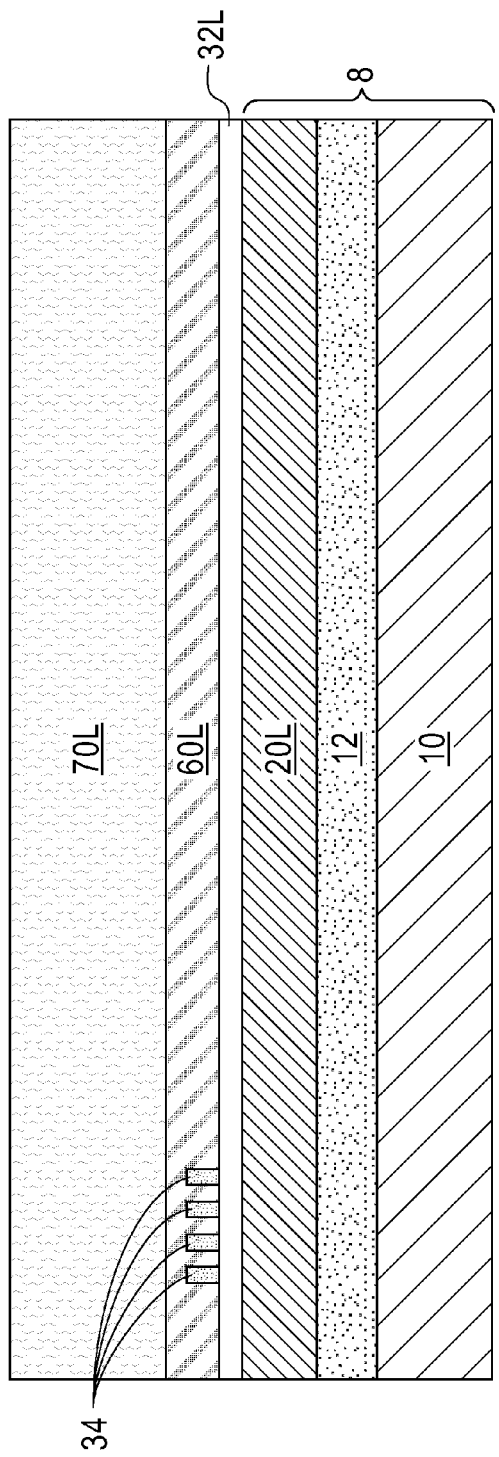
FIG. 5 is a cross-sectional view of the exemplary semiconductor structure of FIG. 4 after forming a hard mask layer over the dielectric cap layer to fill the spaces between the transfer layer portions and forming a mandrel material layer over the hard mask layer.

Referring to FIG. 5, a hard mask layer 60L is formed over the dielectric cap layer 32L to fill the spaces between the transfer layer portions 34. The hard mask layer 60L may include any material that can be etched selective to the materials of the transfer layer 34L and the dielectric cap layer 32L. In one embodiment and when the dielectric cap layer 32L is composed of a dielectric oxide and the transfer layer 34 is composed of a dielectric metal oxide, the hard mask layer 60L can include a dielectric nitride such as silicon nitride. The hard mask layer 60L can be formed by CVD, PVD or spin coating. The hard mask layer 60L may be self-planarizing, or the top surface of the hard mask layer 60L can be planarized, for example, by chemical mechanical planarization (CMP). The planarized top surface of the hard mask layer 60L thus formed is located above the top surfaces of the transfer layer portions 34.

A mandrel material layer 70L is subsequently formed over the hard mask layer 60L. The mandrel material layer 70L includes a material that can be removed selective to the materials of the hard mask layer 60L and sidewall spacers to be subsequently formed. In one embodiment, the mandrel material layer 70L may be composed of amorphous silicon, polysilicon, amorphous or polycrystalline germanium, an amorphous or polycrystalline silicon-germanium alloy material, amorphous carbon, diamond-like carbon or organosilicate glass. In some embodiments, the mandrel material layer 70L may also be composed of a metal, such as, for example, Al, W or Cu. The mandrel material layer 70L can be formed, for example, by CVD or PECVD. The thickness of the mandrel material layer 70L can be from 30 nm to 300 nm, although lesser and greater thicknesses can also be employed.

Figure 6:
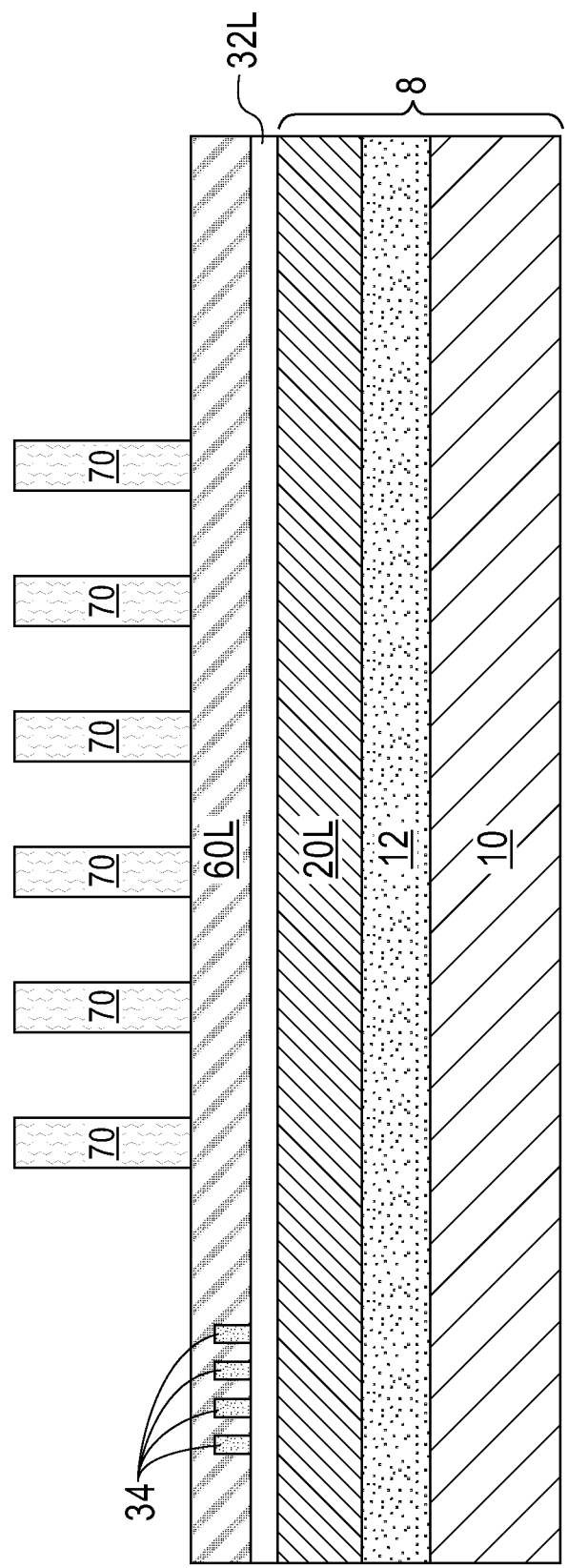
FIG. 6 is a cross-sectional view of the exemplary semiconductor structure of FIG. 5 after patterning the mandrel material layer to form mandrels.

Referring to FIG. 6, the mandrel material layer 70L is patterned to form mandrels 70. The patterning of the mandrel material layer 70L can be performed, for example, by applying a photoresist layer (not shown) over the mandrel material layer 70L, lithographically patterning the photoresist layer to define a set of areas covered by the patterned photoresist layer, and transferring the pattern in the photoresist layer into the mandrel material layer 70L by an anisotropic etch. The anisotropic etch can be a dry etch such as, for example, RIE or a wet etch selective to the dielectric material of the hard mask layer 60L. The remaining portions of the mandrel material layer constitute the mandrels 70. The mandrels 70 are formed in a second region of the substrate 8 which can be a SRAM device region.

In one embodiment, each of the mandrels 70 that is formed may have a rectangular shape in cross-section. The mandrels 70 can be formed with uniform width and spacing or variable width and spacing depending on the circuit design. In one embodiment and as shown in FIG. 6, the mandrels 70 have uniform width and spacing. The width and spacing of the mandrels 70 are set such that the spacers later formed on sidewalls of the mandrels 70 can have a pitch that is a non-integer multiple of the natural pitch $L_0$ of the DSA material. In one embodiment, the mandrels 70 are formed according to a minimum pitch available to the lithographic fabrication process being used. In one embodiment and when the minimum pitch is 80 nm, the mandrels 70 are formed having a width of 30 nm with a spacing of 50 nm.

Figure 7:
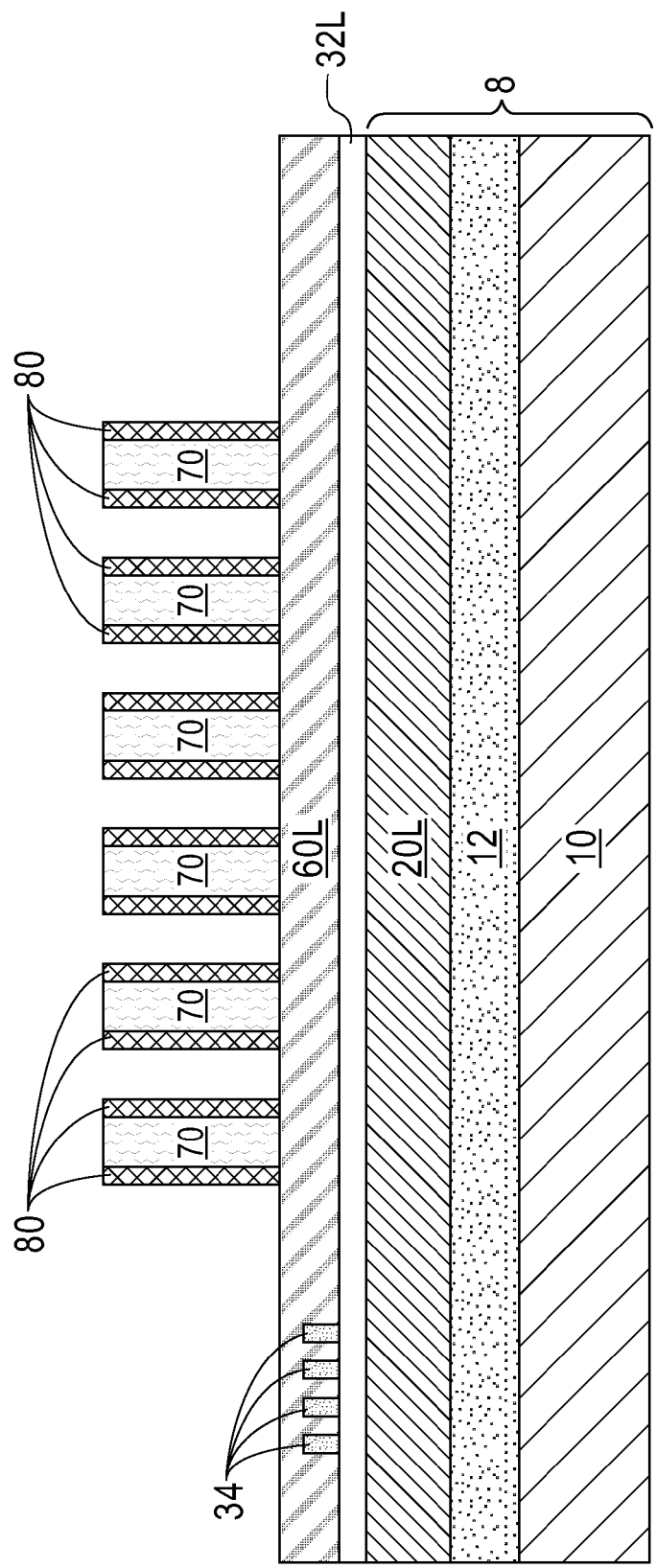
FIG. 7 is a cross-sectional view of the exemplary semiconductor structure of FIG. 6 after forming spacers along sidewalls of the mandrels.

Referring to FIG. 7, spacers 80 are formed along the sidewalls of the mandrels 70. The spacers 80 may be composed of a dielectric material that has an etch selectivity that differs with respect to the materials of the hard mask layer 60L and the mandrels 70. In one embodiment of the present application, the spacers 80 may include a dielectric oxide such as silicon oxide.

The spacers 80 can be formed by depositing a spacer material layer (not shown) over exposed surfaces of the mandrels 70 and the hard mask layer 60L by a conformal deposition process, such as, for example, CVD, PECVD or ALD. The spacer material layer that is formed may have a thickness from 5 nm to 15 nm, although lesser and greater thicknesses can also be employed. Following the conformal deposition, an anisotropic etch such as, for example, RIE is performed to completely remove the spacer material deposited on the horizontal surfaces of the hard mask layer 32L and the mandrels 70, while the spacer material deposited on vertical sidewalls of the mandrels 70 is retained. The remaining portions of the spacer material layer constitute the spacers 80.

Figure 8:
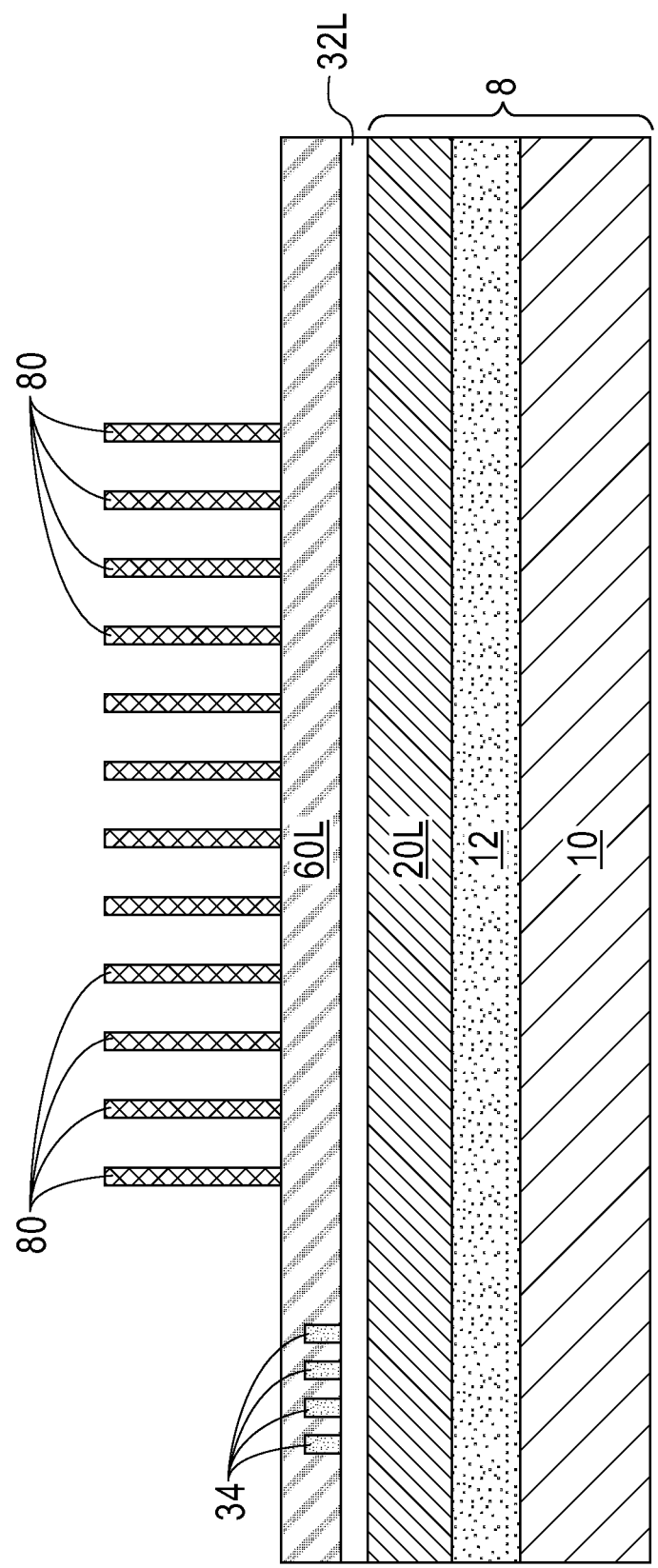
FIG. 8 is a cross-sectional view of the exemplary semiconductor structure of FIG. 7 after removing the mandrels.

The width of each of the spacers 80, as measured at its base, can be from 5 nm to 10 nm, although lesser and greater widths can also be employed. After removal of the horizontal portions of the spacer material layer, top surfaces of the mandrels 70 are exposed Referring to FIG. 8, a mandrel pull process is performed to remove the mandrels 70 from the structure, leaving the spacers 80 standing free on the hard mask layer 60L. Any wet or dry etch process capable of etching the material of the mandrels 70 selective to the materials of the spacers 80 and the hard mask layer 60L can be used. For example, if the mandrels 70 include a semiconductor material, the mandrels 70 can be removed utilizing an oxygen-based plasma etching technique that removes the semiconductor material while not removing the dielectric material of the spacers 80. In one embodiment, the spacers 80 are formed with a uniform pitch which can be a non-integer multiple of the natural pitch $L_0$ of the DSA pattern.

Figure 9:
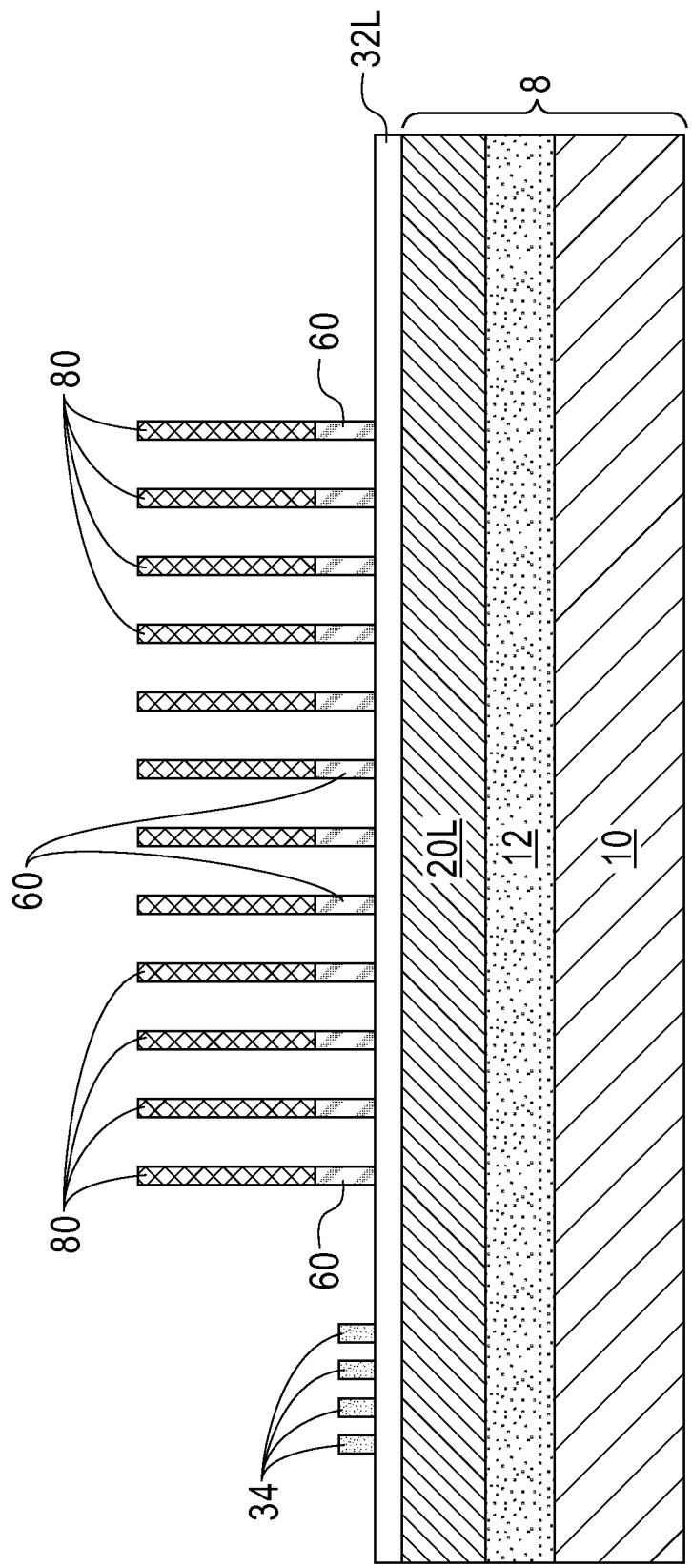
FIG. 9 is a cross-sectional view of the exemplary semiconductor structure of FIG. 8 after patterning the hard mask layer using the spacers as an etch mask to provide hard mask layer portions.

Referring to FIG. 9, the hard mask layer 60L is etched by an anisotropic etch employing the spacers 80 as an etch mask. The anisotropic etch removes physically exposed portions of the hard mask layer 60L to provide hard mask layer portions 60 which are remaining portions of the hard mask layer 60L after the anisotropic etch. The removal of the exposed portions of the hard mask layer 60L also reveals the transfer layer portions 34.

Referring to FIG. 10, the dielectric cap layer 32L is etched by an anisotropic etch employing the transfer layer portions 34 and stacks of the hard mask layer portions 60 and the spacers 80 as an etch mask layer. The anisotropic etch can be a dry etch such as RIE or a wet etch that removes the dielectric material of the dielectric cap layer 32L selective to the materials of the transfer layer portions 34, the hard mask layer portions 60 and the spacers 80. The remaining portions of the dielectric cap layer 32L constitutes the dielectric cap 32. The spacers 80 are then removed, for example, with a HF-based wet etch.

Referring to FIG. 11, the top semiconductor layer 20L is etched by an anisotropic etch employing the transfer layer portions 34 and the hard mask layer portions 60 as an etch mask. The anisotropic etch can be a dry etch such as RIE or a wet etch that removes the semiconductor material of the top semiconductor layer 20L selective to the materials of the transfer layer portions 34, the hard mask layer portions 60 and the dielectric cap 32. The remaining portions of the top semiconductor layer 20L constitutes the semiconductor fins. The semiconductor fins includes a plurality of first semiconductor fins 20 located in first region of the substrate (10, 12) and a plurality of second semiconductor fins 20B located in the second region substrate (10, 12). The first semiconductor fins 20A are densely packed fins having a pitch $P_1$ equals to the natural pitch of the DSA material $L_0$. The second semiconductor fins 20B are semi-isolated from each other and have a pitch $P_2$ that is a non-integer multiple of the natural pitch of the DSA material $L_0$.

The transfer layer portions 34 and the spacer 80 are then removed (not shown), for example with a HF-based wet etch and oxygen-based plasma, respectively, leaving the semiconductor fins (20A, 20B) standing on the buried insulator layer 12. From this point, the semiconductor fins (20A, 20B) may be used in any further fabrication processes. The greater pitch of the second semiconductor fins 20B ensures merged source/drain regions can only be formed in the logic device region, but not the SRAM device region.

In the present application, by forming a plurality of densely packed semiconductor fins 20A in a first device region using a DSA process and a plurality of semi-isolated semiconductor fins 20B in a second device region using a SIT process, fins with a constant pitch and fins with variable pitches can be formed over a same substrate. The full range of constructs required for FinFET patterning can be addressed. This can greatly enhance the processing flexibility.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming a self-assembled structure comprising alternating first domains and second domains over a material stack that is located over a top semiconductor layer of a substrate, wherein the material stack comprises a transfer layer and a process layer overlying the transfer layer, and the self-assembled structure overlies a first region of the top semiconductor layer;
   removing the second domains of the self-assembled structure, leaving the first domains protruding from a top surface of the process layer;
   patterning the process layer and the transfer layer using the first domains as an etch mask to provide transfer layer portions over the top semiconductor layer;
   removing remaining portions of the process layer, leaving the transfer layer portions protruding from a top surface of the top semiconductor layer;
   forming a hard mask layer over the transfer layer portions and the top semiconductor layer, the hard mask layer filling spaces between the transfer layer portions;
   forming spacers on sidewalls of a plurality of mandrels located over the hard mask layer, the plurality of mandrels overlying a second region of the top semiconductor layer;
   removing the plurality of mandrels, leaving the spacers protruding from a top surface of the hard mask layer;
   patterning the hard mask layer using the spacers as an etch mask to provide hard mask layer portions; and
   patterning the top semiconductor layer using the transfer layer portions and the hard mask layer portions as an etch mask to provide a plurality of semiconductor fins.

2. The method of claim 1, wherein the first domains comprise a first chemical component of a directed self-assembly (DSA) material, and the second domains comprise a second chemical component of the DSA material.

3. The method of claim 2, wherein the transfer layer portions have a pitch the same as a natural pitch of the DSA material.

4. The method of claim 3, wherein the natural pitch of the DSA material equals to a total width of two adjacent first and second domains.

5. The method of claim 3, wherein the spacers have a pitch that is equal to a non-integer multiple of the natural pitch of the DSA material.

6. The method of claim 2, wherein the DSA material comprises a diblock copolymer, a triblock copolymer, a blend of homopolymers, a blend of copolymers, and a combination thereof.

7. The method of claim 1, wherein the transfer layer comprises a high-k dielectric constant material.

8. The method of claim 1, wherein the process layer comprises silicon-containing antireflective coating (SiARC) material or a titanium-containing antireflective coating (TiARC) material.

9. The method of claim 1, wherein the forming the self-assembled structure comprises:
   forming template structures over the material stack;
   depositing a directed self-assembly (DSA) material onto the topmost surface of the material stack and between the template structures; and
   annealing the DSA material to cause the directed self-assembly of the DSA material to form the alternating first domains and second domains.

10. The method of claim 9, further comprising removing the template structure after the forming the self-assembled structure.

11. The method of claim 1, further comprising forming the plurality of mandrel structures, wherein the forming the plurality of mandrel structures comprises:
    forming a mandrel material layer over the hard mask layer; and
    patterning the mandrel material layer to provide the plurality of mandrel structures over the hard mask layer.

12. The method of claim 1, wherein the forming the spacers comprises:
    forming a spacer material layer on exposed surfaces of the plurality of mandrels and the hard mask layer; and
    removing horizontal portions of the spacer material layer, leaving vertical portions of the spacer material layer on the sidewalls of the plurality of mandrels.

13. The method of claim 1, wherein the substrate further comprises a buried insulator layer located beneath the top semiconductor layer and a hand substrate located beneath the buried insulator layer.

14. The method of claim 1, wherein the material stack further comprises a dielectric cap layer located between the top semiconductor layer and the transfer layer and an organic planarization layer (OPL) located between the transfer layer and the process layer.

15. The method of claim 14, wherein the patterning the process layer and the transfer layer using the first domains as an etch mask to provide the transfer layer portions further comprises patterning the OPL.

16. The method of claim 14, further comprising the dielectric cap layer using the transfer layer portions and the hard mask layer portions as an etch mask prior to the patterning the top semiconductor layer.

* * * * *